United States Patent [19]
Horiba

[11] Patent Number: 5,952,724
[45] Date of Patent: Sep. 14, 1999

[54] SEMICONDUCTOR DEVICE INCORPORATING A STEPPED CONTACT HOLE

[75] Inventor: Shinichi Horiba, Tokyo, Japan

[73] Assignee: NEC Corporation, Tokyo, Japan

[21] Appl. No.: 08/878,947

[22] Filed: Jun. 19, 1997

[30] Foreign Application Priority Data

Jun. 20, 1996 [JP] Japan ................................ 8-159295

[51] Int. Cl.⁶ .............................................. H01L 23/528
[52] U.S. Cl. ............................................ 257/774; 257/904
[58] Field of Search .................................. 257/903, 904, 257/393, 773, 774

[56] References Cited

U.S. PATENT DOCUMENTS

| | | | |
|---|---|---|---|
| 5,352,916 | 10/1994 | Kiyono et al. | 257/393 |
| 5,661,325 | 8/1997 | Hayashi et al. | 257/393 |
| 5,714,778 | 2/1998 | Yamazaki | 257/903 |

FOREIGN PATENT DOCUMENTS

| | | |
|---|---|---|
| 2-285658 | 11/1990 | Japan . |
| A 3-008360 | 1/1991 | Japan . |
| A 3-126246 | 5/1991 | Japan . |
| A 5-036920 | 2/1993 | Japan . |

*Primary Examiner*—David B. Hardy
*Attorney, Agent, or Firm*—Sughrue, Mion, Zinn, Macpeak & Seas, PLLC

[57] ABSTRACT

Semiconductor elements, such as driving MOS transistors, transfer MOS transistors and the like are formed in a element region defined on the surface of a semiconductor substrate. A first interlayer insulation layer is formed on these surfaces. A grounding wiring layer is formed over substantially entire surface of the first interlayer insulation layer. Also, a silicon nitride layer and a second interlayer insulation layer are formed sequentially on the surface of the grounding wiring layer. Then, a first contact hole reaching a gate electrode of the driving MOS transistor is provided at a desired position. Then, a side wall insulation layer of silicon nitride layer is formed only on the side wall surface of the grounding wiring layer facing the contact hole.

18 Claims, 8 Drawing Sheets

SEMICONDUCTOR DEVICE INCORPORATING A STEPPED CONTACT HOLE

BACKGROUND OF THE INVENTION

1. Field of the Invention

The present invention relates to a semiconductor device with a contact hole extending through a wiring layer on a semiconductor substrate and electrically connecting an upper layer and a lower layer of the wiring layer, and a fabrication process therefor.

2. Description of the Prior Art

FIG. 1 is an equivalent circuit diagram showing a general static memory cell (SRAM cell). As shown in FIG. 1, the SRAM cell formed on a semiconductor substrate as a semiconductor device is constructed with two high resistance load elements (load resistors R1 and R2) and four N-channel MOS transistors T1, T2, T3 and T4. Among these MOS, transistors consisting of a pair of driving MOS transistors T1 and T2, a drain of one transistor is connected to a gate of the other transistor, and is connected to one end of the load resistor R1 or R2. Namely, the drain of the MOS transistor T1 is connected to the gate of the MOS transistor T2 and one end of the load resistor R1. On the other hand, the drain of the MOS transistor T2 is connected to the gate of the MOS transistor T1 and one end of the load resistor R2. Sources of respective MOS transistors T1 and T2 are fixed to a grounding potential $V_{ss}$. By this, a flip-flop circuit is constructed.

A power source voltage $V_{cc}$ is applied on the other ends of the load resistors R1 and R2. By this, a fine current may be supplied to the flip-flop circuit. Also, accumulation nodes N1 and N2 of the flip-flop circuit are respectively connected to the drains or sources of the transfer MOS transistors T3 and T4. The sources or drains of the transfer MOS transistors T3 and T4 are connected to two data lines 2a and 2b extending in parallel. Furthermore, one word line 1a extending perpendicular to the data lines 2a and 2b is connected to gates of the transfer MOS transistors T3 and T4. By this, a one-bit memory cell is constructed.

In the SRAM cell constructed as set forth above, a plate form grounding wiring (grounding potential $V_{ss}$) is formed over the entire surface of the cell. When resistance of the grounding wiring is reduced, the flip-flop circuit of the cell can be operated stably at low voltage. As a technology for forming the plate form grounding wiring, contact formation technology is known (Japanese Unexamined Patent Publication (Kokai) No. Heisei 2-285658.

FIGS. 2A to 2D are sections showing sequential process steps of conventional fabrication process of the semiconductor device utilizing contact forming technology. As shown in FIG. 2A, at first, a P-type well layer 2 is formed by ion implantation of boron in the surface of the semiconductor substrate 1 and by thermal diffusion. Next, a field oxide layer 3 in a thickness of 1000 to 5000 Å thick is selectively formed on the surface of the P-type well layer 2 by using LOCOS method. By this, an element region is defined. Subsequently, a gate oxide layer 4 is formed in a thickness of 100 to 300 Å on the surface of the element region (P-type well layer 2).

Thereafter, an opening portion 7 is selectively formed through the gate oxide layer 4. Then, a conductive layer (not shown) of a polycrystalline silicon or the like is formed over the entire surface in a thickness of 1000 to 3000 Å. A gate electrode 5a of a driving MOS transistor and gate electrodes 5b of transfer MOS transistors are formed by selectively removing the conductive layer through photolithographic and dry etching. Subsequently, with taking the gate electrodes 5a and 5b as a mask, ion implantation of arsenic is performed over the entire surface to form a N-type impurity diffusion layer 6 on the surface of the P-type well layer 2. After formation of a first interlayer insulation layer 8 over the entire surface, a grounding wiring layer 9 of polycrystalline silicon, tungsten silicide or the like is formed in a thickness of 1000 to 2000 Å on the first interlayer insulation layer 8. Thereafter, a second interlayer insulation layer 10 is formed in a thickness of 1000 to 2000 Å on the surface of the grounding wiring layer 9.

Then, as shown in FIG. 2B, selectively removing the first interlayer insulation layer 8, the grounding wiring layer 9 and the second interlayer insulation layer 10 formed on the gate electrode 5a of the driving MOS transistor, a first contact hole 11 is provided. By this, a part of the surface of the gate electrode 5a is exposed. Subsequently, a silicon oxide layer 12 is formed in a thickness of 500 to 2000 Å on the inner periphery of the first contact hole 11 (on the side wall surface and the bottom wall surface of the contact hole) and on the upper surface of the second interlayer insulation layer 10.

Thereafter, as shown in FIG. 2C, the silicon oxide layer 12 located on the upper surface of the second interlayer insulation layer 10 and on the bottom wall surface of the contact hole 11 is removed by way of anisotropic etching, to remain only silicon oxide layer 12 on the side wall surface of the first contact hole 11. By this, a first side wall insulation layer 13 is formed. Thereafter, on the inner peripheral surface of the first contact hole 11 and on the second interlayer insulation layer 10, a polycrystalline silicon layer (not shown) is formed in a thickness of 500 to 1500 Å. The polycrystalline silicon layer is then doped with phosphorous in a concentration of $1 \times 10^{13}$ to $1 \times 10^{14}$ (/cm$^2$) by way of ion implantation. Then, the polycrystalline silicon layer is patterned by photolithographic and dry etching to form a load resistor 14. Subsequently, ion implantation of phosphorous is performed into a desired position in the load resistor 14, in a concentration of $1 \times 10^{15}$ to $1 \times 10^{16}$ (/cm$^2$) to form a power source wiring portion ($V_{cc}$) 15.

Thereafter, as shown in FIG. 2D, a third interlayer insulation layer 16 is formed over the entire surface. In conjunction therewith, the first contact hole is varied to planarize the surface by the third interlayer insulation layer 16. Subsequently, the first interlayer insulation layer 8, the grounding wiring layer 9 and the second interlayer insulation layer 10 are selectively removed by way of photolithographic and dry etching, to provide a second contact hole 17. By this, a part of the surface of the N-type impurity diffusion layer 6 is exposed. Thereafter, on the inner peripheral surface of the second contact hole 17 (on the side wall surface and on the bottom wall surface of the second contact hole 17) and the upper surface of the third interlayer insulation layer 16, a silicon oxide layer (not shown) is formed in a thickness of 500 to 2000 Å.

Thereafter, the silicon oxide layer located on the upper surface of the third interlayer insulation layer 16 and on the bottom wall surface of the contact hole 17 is removed by anisotropic etching, to leave only silicon oxide layer on the side wall surface of the second contact hole 17. By this, a second side wall insulation layer 18 is formed. Thereafter, over the entire surface, a conductive layer (not shown) of aluminum or so forth is formed in a thickness of 2000 to 10000 Å. In conjunction therewith, the second contact hole is varied by the conductive layer. Then, the conductive layer is patterned by photolithographic and dry etching into the predetermined shape to form a data line 19.

In the semiconductor device constructed as set forth above, since the grounding wiring layer 9 is formed over substantially entire surface on the semiconductor substrate 1, resistance of the grounding wiring layer 9 can be reduced. Thus, the flip-flop circuit can be operated stably at low voltage. Also, while the contact holes 11 and 17 are provided through the grounding wiring layer 9, since the side wall insulation layers 13 and 18 are formed on the side wall surface of the contact holes, shorting between the conductive material filled in the contact holes and the grounding wiring layer 9 can be certainly prevented.

However, when the semiconductor device is fabricated through the conventional process, the following problems should be encountered. The first problem is that the process is complicated and includes a large number of process steps. The reason is that the side wall insulative layers 13 and 18 have to be formed by anisotropic etching of the silicon oxide layers separately upon formation of two different contact holes 11 and 17.

The second problem is that fabrication of masks for providing the contact holes 11 and 17 is complicated. The reason is that the positions to provide the contact holes have to be defined precisely. If the precision of positioning is low, it becomes not possible to provide the contact holes at only on the electrodes to make the contact hole to cause interference with the adjacent electrode located adjacent the desired electrode to cause shorting between the electrodes.

SUMMARY OF THE INVENTION

It is therefore an object of the present invention to provide a semiconductor device with a contact hole and the fabrication process which can reduce process steps in the fabrication process, and preferably by neglecting complicate positioning process of a mask in forming to facilitate fabrication of the semiconductor device.

A semiconductor device with a contact hole, according to the present invention, has a semiconductor element formed on a semiconductor substrate. A first interlayer insulation layer is formed on the semiconductor element. A conductive layer is formed on the first interlayer insulation layer. A contact hole comprising a first portion and a second portion is provided, with the first portion of the contact hole being provided through the conductive layer. A second interlevel insulation layer is formed on the upper surface of the conductive layer and the sidewall surface of the first portion of this contact hole, while maintaining the exposure of the first interlayer insulation layer. The second portion of the contact hole is then provided concentrically with the first portion of the contact through the first interlayer insulation layer, thereby exposing the semiconductor element.

The first interlayer insulation layer may have different etching selectivity to that of the second interlevel wiring insulation layer.

Also, the semiconductor device according to the present invention, may include a third interlayer insulation layer formed on the upper surface of the second interlevel wiring insulation layer. In this case, the second interlevel insulation layer may have different etching selectivity to those of the first and third interlayer insulation layers.

The first and third interlayer insulation layers may be formed of silicon oxide and the second interlevel insulation layer may be formed of silicon nitride.

Also, the conductive layer may be a grounding wiring layer formed over substantially entire surface of the semiconductor substrate. The grounding wiring layer may be formed of a conductive material selected among a group consisted of polycrystalline silicon and tungsten silicide.

A fabrication process of a semiconductor device with a contact hole, according to the present invention, includes a step of forming a semiconductor element on a semiconductor substrate. Then, a first interlayer insulation layer is formed on the semiconductor element. Subsequently, a wiring layer is formed on the first interlayer insulation layer. Thereafter, a first wiring insulation layer is formed on the surface of the wiring layer. Then, a preliminary contact hole is provided by removing a predetermined portion in the wiring layer and the first wiring insulation layer by etching. Then, a second wiring insulation layer is formed on the surface of the first wiring insulation layer and on the inner periphery of the preliminary contact hole. Thereafter, the second wiring insulation layer is anisotropically etched with leaving only second wiring insulation layer on the side wall of the preliminary contact hole. Then, a contact hole is provided by removing the first interlayer insulation layer below the preliminary contact hole by etching. Subsequently, a conductive layer is formed on a region of the first wiring insulation layer including the contact hole, and being electrically connected to the semiconductor element through the contact hole.

The fabrication process of a semiconductor device may further comprise step of forming a second interlayer insulation layer on the upper surface of the first wiring insulation layer, between the step of performing anisotropic etching for the second wiring insulation layer and the step of providing the contact hole.

Also, the first and second wiring insulation layers may be formed of silicon nitride and the first and second interlayer insulation layers may be formed of silicon oxide, and an etching agent having higher selectivity for silicon oxide layer than silicon nitride layer may be used in the step of providing the contact hole.

A fabrication process of a semiconductor device, according to the present invention, includes a step of forming MOSFETs having gate electrodes formed of first conductive layers. Then a first interlayer insulation layer is formed on the MOSFETs. Thereafter, a second conductive layer is formed on the first interlayer insulation layer. Then, a first silicon nitride layer is formed on the second conductive layer. Subsequently, a preliminary contact hole is provided by selectively removing the first silicon nitride layer and the second conductive layer by etching. A second silicon nitride layer is then formed on the surface of the first silicon nitride layer and on the inner peripheral surface of the preliminary contact hole. The second silicon nitride layer is anisotropically etched with leaving the second silicon nitride layer on the side wall surface of the preliminary contact hole. Then, a second interlayer insulation layer is formed on the first silicon nitride layer and within the preliminary contact hole. Subsequently, the second interlayer insulation layer and the first interlayer insulation layer at a region of providing the preliminary contact hole are removed to provide a contact hole.

The fabrication process of a semiconductor device, according to the present invention, may further comprise a step of forming a conductive layer electrically connected to the gate electrode of the MOSFET via the contact hole after providing the contact hole, on a region of the second interlayer insulation layer including the contact hole. Also, the MOSFETs may comprise a pair of information transferring MOSFETs and a pair of driving MOSFETs forming a flip-flop circuit, the flip-flow circuit further includes a pair of load elements. Furthermore, the second conductive layer may fix sources of the driving MOSFETs at a grounding potential.

In the present invention, since the upper surface of the wiring layer and the side wall surface of the wiring layer facing the contact hole are covered with the insulation layer, shorting between the conductive layer filled or formed within the contact hole and the wiring layer, will never be caused.

On the other hand, in the fabrication process according to the present invention, by providing the preliminary contact hole in the region of the wiring layer, where the contact hole is provided, the upper surface and the side wall surface facing the preliminary contact hole are covered with the wiring insulation layer of silicon nitride layer. Therefore, it becomes unnecessary to form the insulation layer on the side wall of the contact hole every time of formation of the contact hole to reduce process steps in the semiconductor fabrication process.

When the wiring insulation layer has different etching selectivity to that of the interlayer insulation layer, the contact hole can be provided in self-align. Accordingly, even if precision in positioning of the mask is low, the contact hole can be provided at the desired position with high precision to facilitate the fabrication process of the semiconductor device.

BRIEF DESCRIPTION OF THE DRAWINGS

The present invention will be understood more fully from the detailed description given hereinafter and from the accompanying drawings of the preferred embodiment of the present invention, which, however, should not be taken to be limitative to be present invention, but are for explanation and understanding only.

In the drawings.

DESCRIPTION OF THE PREFERRED EMBODIMENT

The present invention will be discussed hereinafter in detail in terms of the preferred embodiment of the present invention with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to avoid unnecessary obscure the present invention.

Figure 1:
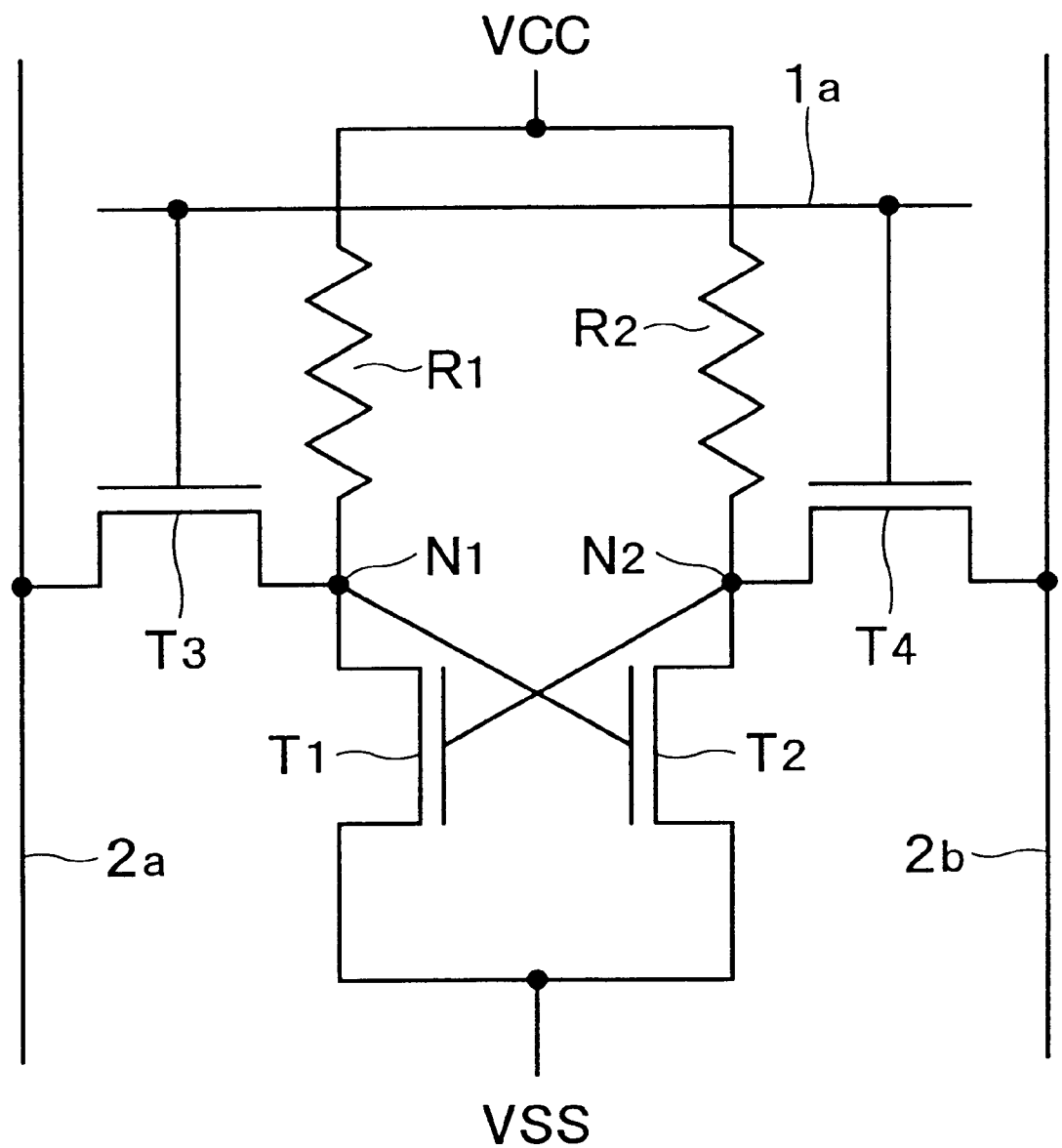
FIG. 1 is an equivalent circuit diagram showing a general static memory cell (SRAM cell)
Figure 2A:
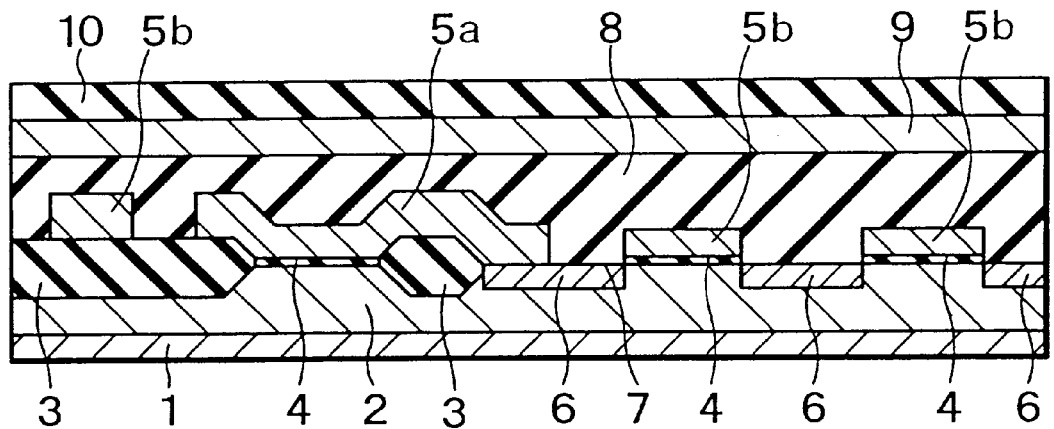
FIGS. 2A to 2D are sections showing sequential process steps of conventional fabrication process of the semiconductor device utilizing contact forming technology.
Figure 2B:
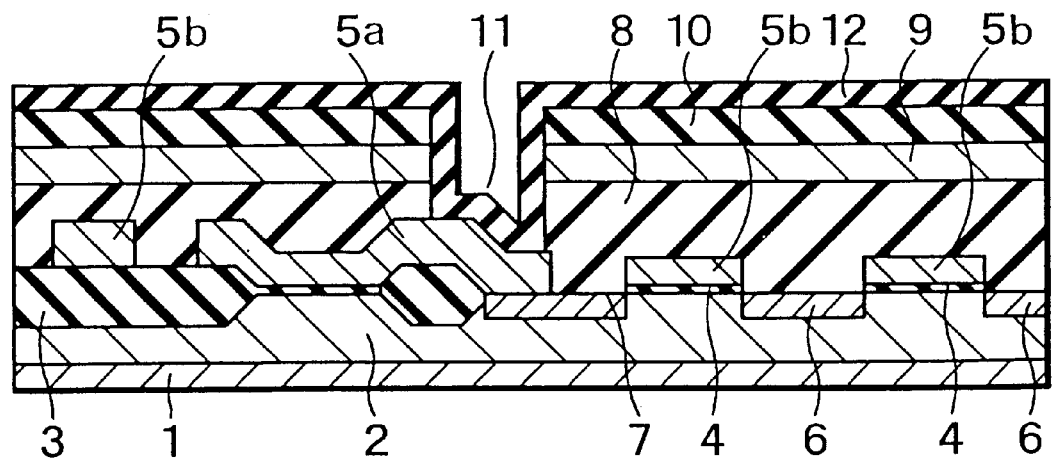
Figure 2C:
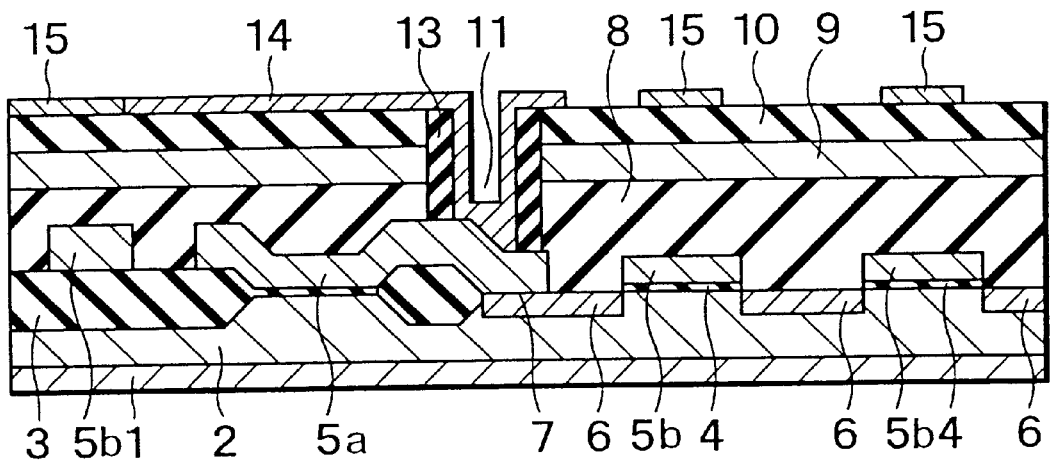
Figure 2D:
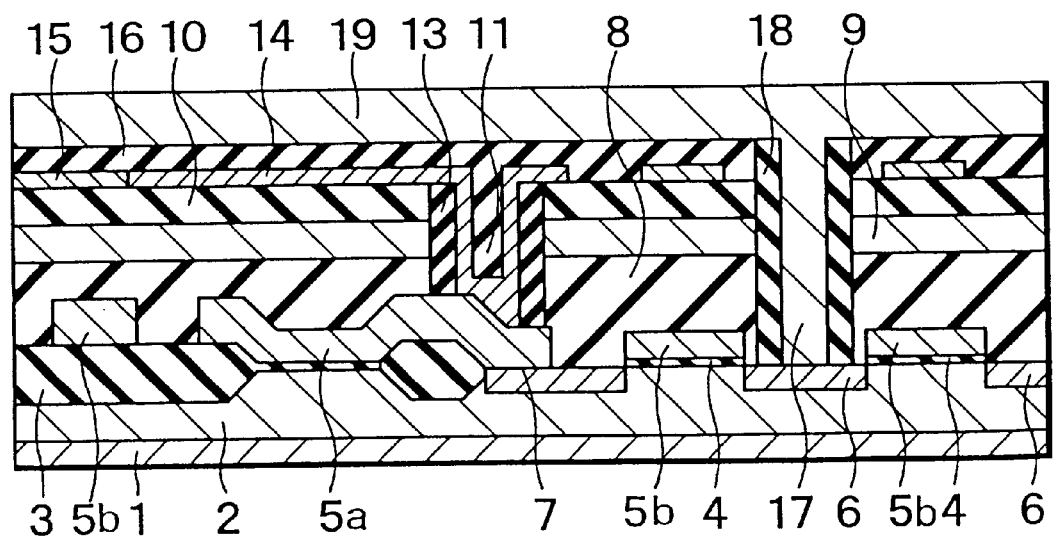
Figure 3A:
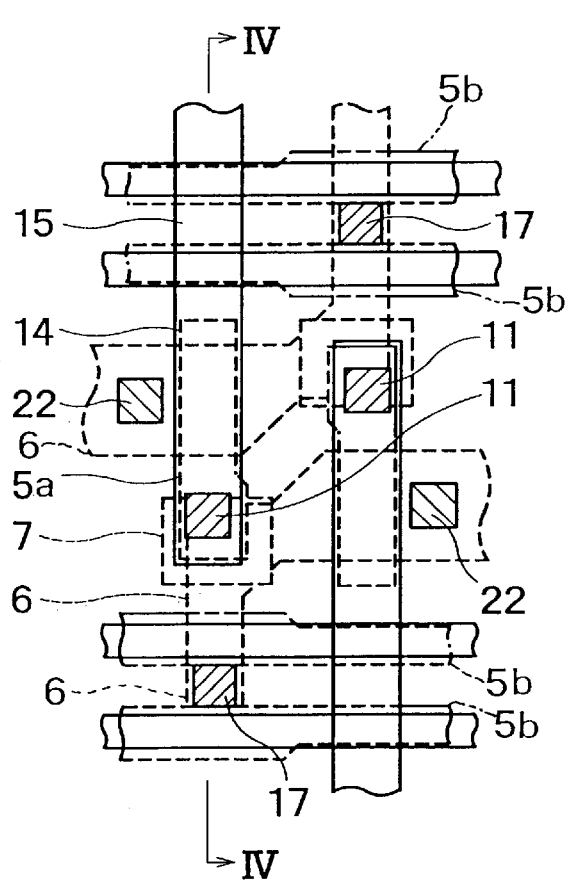
FIG. 3A is a plan view showing the first embodiment of a semiconductor device according to the present invention.
Figure 3B:
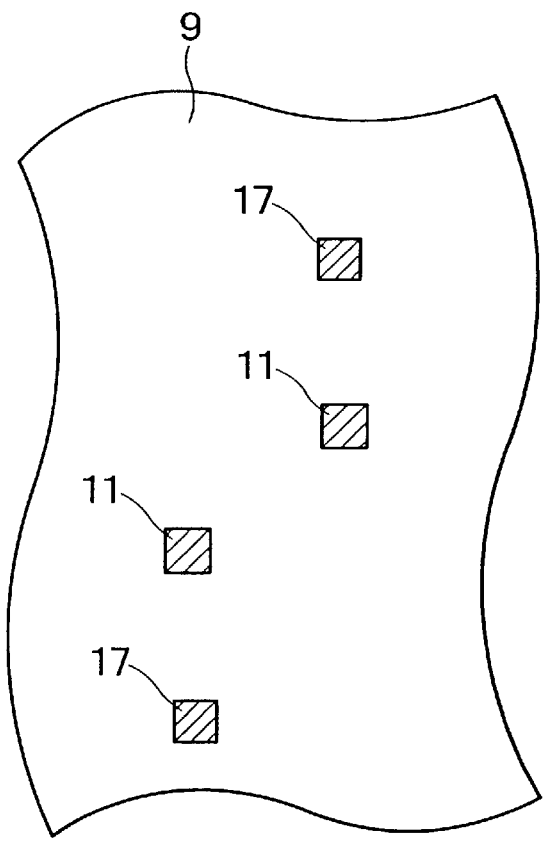
FIG. 3B is a plan view showing the grounding wiring layer in the semiconductor device of FIG. 3A.
Figure 4:
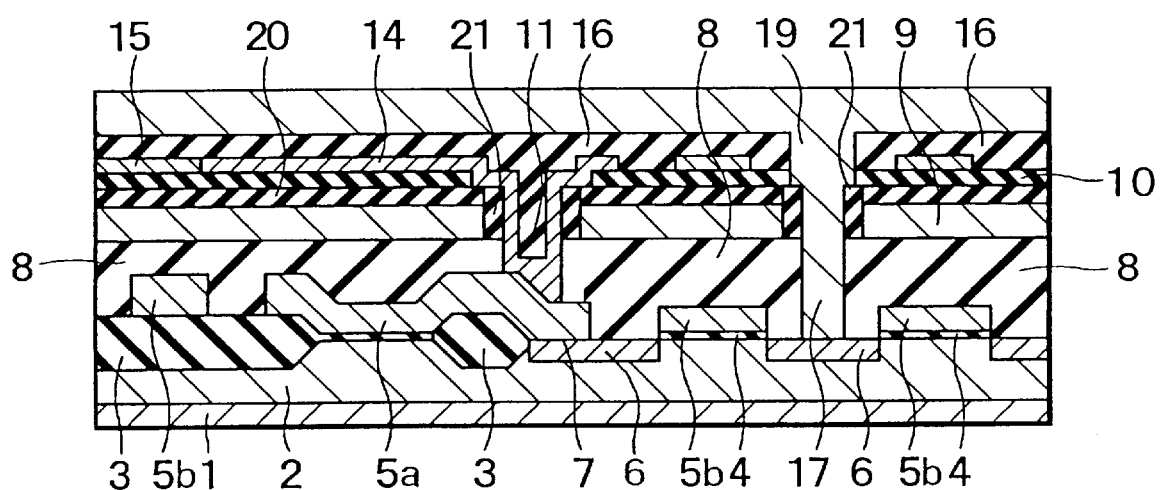
FIG. 4 is a section taken along line IV—IV of FIG. 3A.

The preferred embodiments of a semiconductor device according to the present invention will be discussed with reference to the drawings. FIG. 3A is a plan view showing the first embodiment of a semiconductor device (SRAM cell) according to the present invention, and FIG. 3B is a plan view showing the grounding wiring layer in the semiconductor device of FIG. 3A. FIG. 4 is a section taken along line IV—IV of FIG. 3A. In FIG. 3A, a data line 19 and a third interlayer insulation layer 16 are neglected for convenience of illustration. In FIGS. 3A and 3B, contact holes 11, 17 and 22 are shown by hatched form.

As shown in FIGS. 3A, 3B and 4, a P-type well layer 2 is formed on the surface of a semiconductor substrate 1. A field oxide layer 3 is selectively formed on the surface of the P-type well layer 2, to define an element region. A gate oxide layer 4 is selectively formed on the surface of the element region. A gate electrode 5a of a driving MOS transistor and gate electrodes 5b of transfer MOS transistors are selectively formed on the predetermined position of the surfaces of the field oxide layer 3, the gate oxide layer 4 and the P-type well layer 2. A N-type impurity diffusion layer 6 is formed on the surface of the P-type well layer 2 where the field oxide layer 3, the gate oxide layer 4 and the gate electrode 5a, 5b are not formed. By this, the transfer MOS transistor and the driving MOS transistor are formed. It should be noted that a part of the gate electrode 5a of the driving MOS transistor and the N-type impurity diffusion layer 6 are contacted through an opening portion 7 selectively provided in the gate oxide layer 4.

On the other hand, the first interlayer insulation layer 8 is formed on the surface of these including the gate electrode 5a and 5b. A grounding wiring layer 9 is formed over substantially entire surface of the first interlayer insulation layer 8. Also, a silicon nitride layer 20 and a second interlayer insulation layer 10 are formed on the surface of the grounding wiring layer 9 sequentially. A contact hole 11 is provided at the desired position of the second interlayer insulation layer 10, the silicon nitride layer 20, the grounding wiring layer 9 and the first interlayer insulation layer 8. By this, a part of the surface of the gate electrode 5a of the driving MOS transistor is exposed. A load resistor 14 of polycrystalline silicon is selectively formed on the upper surface of the second interlayer insulation layer 10 and on the inner peripheral surface of the first contact hole 11. By this, the load resistor 14 and the gate electrode 5a are electrically connected. A power source wiring portion 15 doped with high concentration impurity is formed on a desired portion of the load resistor 14.

Also, a third interlayer insulation layer 16 is formed on the surface of these. Then, contact hole 17 is provided in the desired position of the third interlayer insulation layer 16, the second interlayer insulation layer 10, the silicon nitride layer 20, the grounding wiring layer 9 and the first interlayer insulation layer 8. By this, a part of the surface of the N-type impurity diffusion layer 6 is exposed. A data line of a conductive material is formed on the upper surface of the third interlayer insulation layer 16. The contact hole 17 is buried by the data line 19, and the data line 19 and the N-type impurity diffusion layer 6 is electrically connected.

It should be noted that, in the shown embodiment, a side wall insulation layer 21 is formed only on the side wall surface of the grounding wiring layer 9 facing contact hole 11 and 17, so that the load resistance 14 and the data line 19 formed on the inner periphery of the contact holes 11 and 17 or filled therein, are respectively insulated by the grounding wiring layer 9.

Figure 5A:
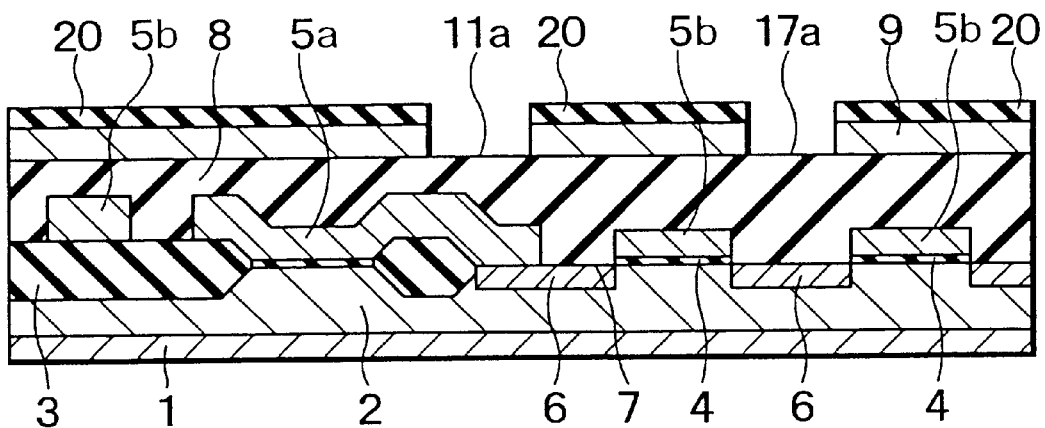
FIGS. 5A to 5D are sections showing sequential process steps of the first embodiment of the fabrication process of a semiconductor device according to the present invention.

Next, discussion will be given for a fabrication process of the SRAM cell constructed as set forth above. FIGS. 5A to 5D are sections showing sequential process steps of the first embodiment of a fabrication process of the semiconductor device (SRAM cell) according to the present invention. As shown in FIG. 5A, at first, ion implantation of boron into the surface of the semiconductor substrate 1 is performed. Then, the P-type well layer 2 is formed by thermal diffusion of implanted boron. Subsequently, the field oxide layer 3 is selectively formed in a thickness of 1000 to 5000 Å on the surface of the P-type well layer 2 utilizing LOCOS method. By this, an element region is defined. Subsequently, the gate oxide layer 4 is formed in a thickness of 100 to 300 Å on the surface of the element region (P-type well layer 2).

Then, an opening portion 7 is selectively formed through the gate oxide layer 4. On these surfaces, the conductive layer (not shown) of polycrystalline silicon or the like is formed in a thickness of 1000 to 3000 Å. Thereafter, the conductive layer is selectively removed by photolithographic and dry etching to form the gate electrode 5a of the driving MOS transistor and the gate electrodes 5b of the transfer MOS transistors. Then, with taking the gate electrodes 5a and 5b as a mask, ion implantation of arsenic is performed over the entire surface to form the N-type impurity diffusion layer 6 on the surface of the P-type well layer 2.

Subsequently, on these surfaces, the first interlayer insulation layer 8 of silicon oxide layer or the like is formed. Subsequently, the contact hole 22 (FIG. 3) is provided at the desired position of the first interlayer insulation layer 8, for electrically connecting the driving MOS transistor and the grounding wiring layer. Thereafter, the grounding wiring layer of polycrystalline silicon, tungsten silicide or the like is formed over the upper surface of the first interlayer insulation layer 8 in a thickness of 1000 to 2000 Å. In conjunction therewith, the first contact hole 22 is buried by the grounding wiring layer 9. Then, the first silicon nitride layer 20 is formed in a thickness of 500 to 1000 Å on the surface of the grounding wiring layer 9.

A photoresist film (not shown) is formed on the surface of the first silicon nitride layer 20. After patterning over the reserved regions for providing all of the contact holes, the reserved regions for the contact hole in the grounding wiring layer 9 and the first silicon nitride layer 20 are removed by dry etching. By this, preliminary contact holes 11a and 17a exposing parts of the surface of the first interlayer insulation layer 8 is provided.

Figure 5B:
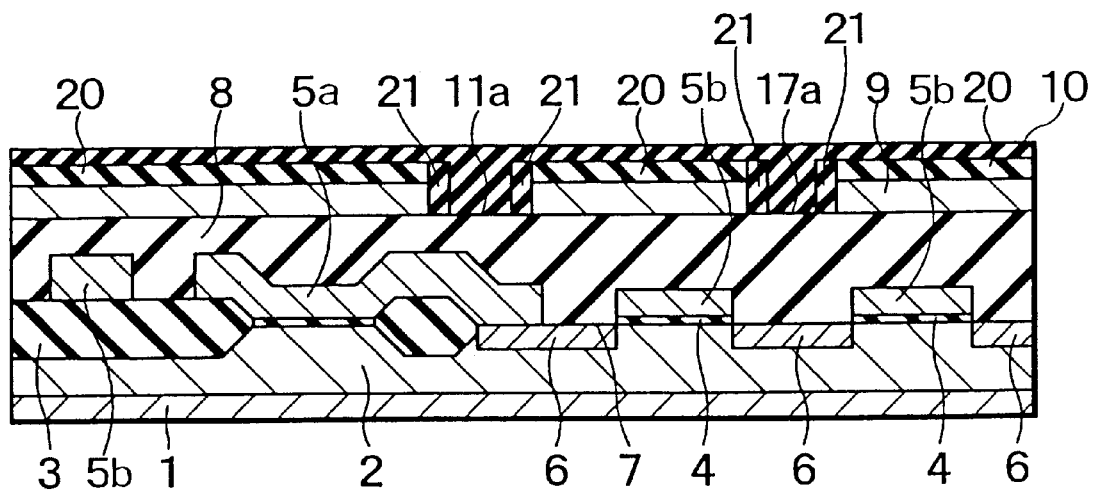

Thereafter, as shown in FIG. 5B, the second silicon nitride layer (not shown) is formed in a thickness of 500 to 1000 Å on the surface of the first silicon nitride layer 20 and on the inner peripheral surfaces of the preliminary contact holes 11a and 17a. The second silicon nitride layer on the upper surface of the first silicon nitride layer 20 and on the bottom wall surface of the preliminary contact holes 11a and 17a is removed by way of anisotropic etching. By this, the second silicon nitride layer is remained only on the side wall surface of the grounding wiring layer 9, to form the side wall insulation layer 21. Then, the second interlayer insulation layer 10 is formed on the upper surface of the first silicon nitride layer 20. In conjunction therewith, the preliminary contact holes 11a and 17a are buried by the second interlayer insulation layer 10. Also, the entire surface is planarized.

Figure 5C:
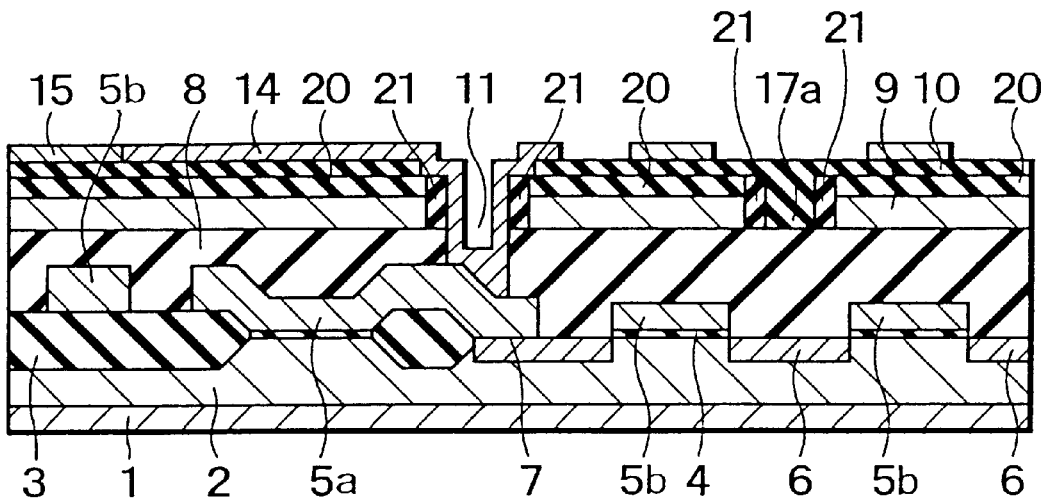

Subsequently, as shown in FIG. 5C, using $CHF_3$ and CO as etching agent having higher selectivity for the silicon oxide layer in comparison with that for the silicon nitride layer, dry etching of the oxide layer is performed to remove the desired portion of the first interlayer insulation layer 8. By this, the contact hole 11 which exposes a part of the surface of the gate electrode 5a of the driving MOS transistor is provided. Then, the polycrystalline silicon layer (not shown) is formed in a thickness of 500 to 1500 Å on the inner periphery of the contact hole 11 and the upper surface of the second interlayer insulation layer 10. Phosphorous is doped into the polycrystalline silicon layer in the concentration of $1\times10^{13}$ to $1\times10^{14}$ (/cm$^2$) by way of ion implantation. Then, the polycrystalline silicon layer is patterned into a desired shape by way of photolithographic and dry etching to form the load resistor 14. Thereafter, phosphorous is doped into a desired position in the load resistor 14 in the concentration of $1\times10^{15}$ to $1\times10^{16}$ (/cm$^2$) by using photolithography, to form the power source wiring portion ($V_{cc}$) 15.

Figure 5D:
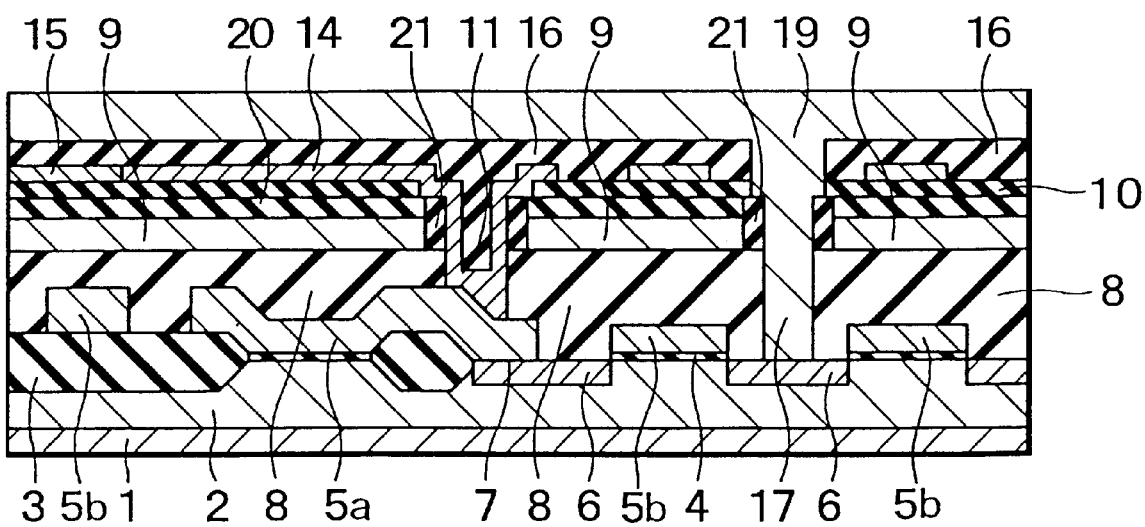

Thereafter, as shown in FIG. 5D, the third interlayer insulation layer 16 is formed over the entire surface. In conjunction therewith, the contact hole 11 is buried with the third interlayer insulation layer 16. Then, the photoresist film (not shown) is formed on the third interlayer insulation layer 16 and the reserved region for the second contact hole at the photoresist film is patterned. Then, using $CHF_3$ and CO as etching agent having higher selectivity for the silicon oxide layer in comparison with that for the silicon nitride layer, dry etching for the oxide layer is performed. By this, the desired portion of the third, second and first interlayer insulation layers 16, 10 and 8 are removed to provide the contact hole 17 through which a part of the surface of the N-type impurity diffusion layer 6 is exposed.

Subsequently, the conductive layer (not shown) of aluminum or the like is formed on the third interlayer insulation layer 16 in a thickness of 2000 to 10000 Å with burying the contact hole 17. Thereafter, the conductive layer is patterned by photolithographic and dry etching into a desired shape. Thus, the data line 19 electrically connected to the N-type impurity diffusion layer 6, is formed.

In the shown embodiment, the preliminary contact holes 11a and 17a are provided in the reserved regions for providing all of the contact holes in the grounding wiring layer 9 to cover the upper surface of the grounding wiring layer 9 with the first silicon nitride layer 20, and the side wall surface of the grounding wiring layer 9 facing the preliminary contact hole is covered with the side wall insulation layer 21 of the second silicon nitride layer. Accordingly, it becomes unnecessary to form the insulation layer on the side wall surface of the contact holes at every occasion of formation of the contact holes 11 and 17 in the subsequent steps. Thus, process steps in the semiconductor fabrication process can be successfully reduced.

Also, in the shown embodiment, since the etching selectivity of the first silicon nitride layer 20 and the side wall insulation layer (second silicon nitride layer) 21 have different etching selectivity to those of the interlayer insulation layers 10 and 8, upon removal of the interlayer insulation layers 10 and 8 by etching, the contact holes 11 and 17 can be provided in self-align. Accordingly, even when precision in positioning of the mask is low, the contact hole can be provided at the desired position with high precision to facilitate the fabrication process of the semiconductor device.

Figure 6A:
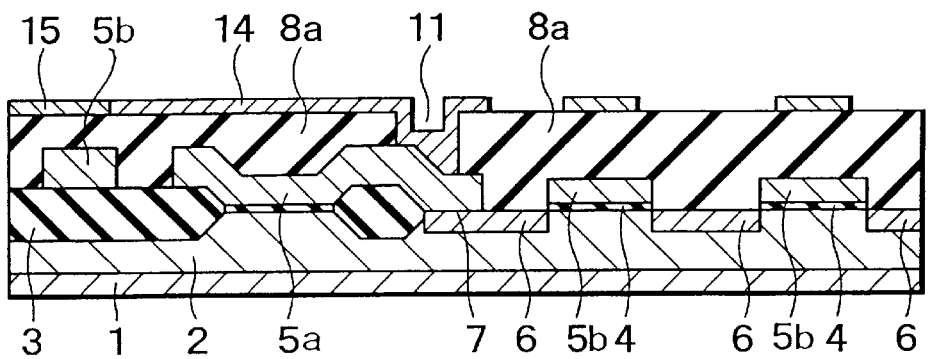
FIGS. 6A to 6C are sections showing sequential process steps of the second embodiment of the fabrication process of a semiconductor device according to the present invention.
Figure 6B:
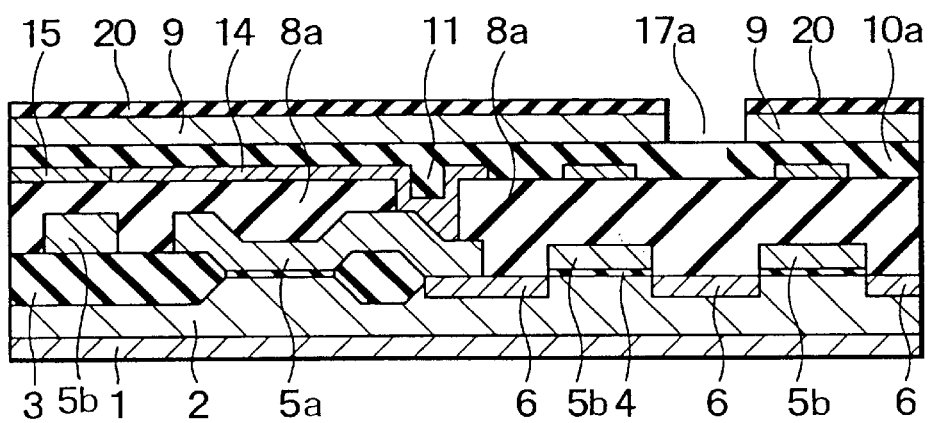
Figure 6C:
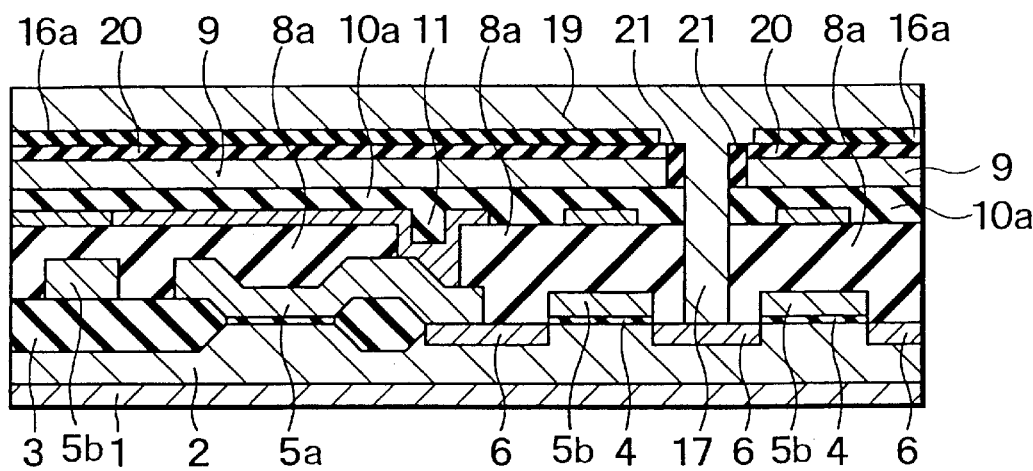

FIGS. 6A to 6C are sections showing sequential process steps of the second embodiment of the fabrication process of a semiconductor device according to the present invention.

In the shown embodiment, like elements to those in the former first embodiment will be identified like reference numerals and the detailed description therefor will be neglected for avoiding redundancy and keep the disclosure simple enough to facilitate clear understanding of the present invention. It should be noted that, in the shown embodiment, the processes up to the step of forming the N-type impurity diffusion layer 6 are the same as those in the first embodiment. Therefore, the following description will be concentrated to the processes after formation of the N-type impurity diffusion layer 6.

As shown in FIG. 6A, after formation of the N-type impurity diffusion layer 6, a first interlayer insulation layer 8a of silicon oxide layer is formed over the entire surface. Then, a photoresist film (not shown) is formed on the surface of the first interlayer insulation layer 8a. Thereafter, the reserved region for providing the contact hole 11 is patterned and dry etching is performed for the first interlayer insulation layer 8a to provide the contact hole 11 exposing a part of the surface of the gate electrode 5a of the driving MOS transistor.

Then, the polycrystalline silicon layer (not shown) is formed in a thickness of 500 to 1500 Å on the inner periphery of the contact hole 11 and the upper surface of the first interlayer insulation layer 8a. Phosphorous is doped into the polycrystalline silicon layer in the concentration of $1\times10^{13}$ to $1\times10^{14}$ (/cm$^2$) by way of ion implantation. Then, the polycrystalline silicon layer is patterned into a desired shape by way of photolithographic and dry etching to form the load resistor 14. Thereafter, phosphorous is doped into a desired position in the load resistor 14 in the concentration of $1\times10^{15}$ to $1\times10^{16}$ (/cm$^2$) by using photolithography, to form the power source wiring portion ($V_{cc}$) 15.

Thereafter, as shown in FIG. 6B, a second interlayer insulation layer 10a is formed in a thickness of 1000 to 2000 Å over the entire surface with burying the contact hole 11. The second interlayer insulation layer 10a also serves for planarizing the surface. Then, the contact hole 22 (FIG. 3) for electrically connecting a source of a driving transistor and a grounding wiring layer is provided at the desired regions of the first and second interlayer insulation layers 8a and b a. Then, the grounding wiring layer 9 of the conductive layer formed of such as polycrystalline silicon, tungsten silicide and the like is formed in a thickness of 1000 to 2000 Å over the surface of the second interlayer insulation layer 10a with burying the contact hole 22. Subsequently, the first silicon nitride layer 20 is formed in a thickness of 500 to 1000 Å on the surface of the grounding wiring layer 9.

Thereafter, a photoresist film (not shown) is formed on the surface of the first silicon nitride layer 20. The photoresist film is patterned at the position aligned with the reserved region for providing the contact hole 17. Then dry etching is performed for removing the reserved region for the second contact hole in the first silicon nitride later 20 and the grounding wiring layer 9. By this, a preliminary contact hole 17a exposing a part of the second interlayer insulation layer 10a is provided.

Then, as shown in FIG. 6C, a second silicon nitride layer is formed in a thickness of 500 to 1000 Å on the surface of the first silicon nitride layer 20 and the inner peripheral surface of the preliminary contact hole 17a. Then, the second silicon nitride layer on the upper surface of the first silicon nitride layer and on the bottom surface of the preliminary contact hole 17a is removed by way of anisotropic etching. By this, the side wall insulation layer 21 of the second silicon nitride layer is formed on the side wall surface of the grounding wiring layer 9 facing the preliminary contact hole 17a. Then, a third interlayer insulation layer 16a is formed on the upper surface of the first silicon nitride layer 20. In conjunction therewith, the preliminary contact hole 17a is buried by the third interlayer insulation layer 16a. At the same time, planarization of the surface is also achieved.

Subsequently, a photoresist film (not shown) is formed on the surface of the third interlayer insulation layer 16a. The photoresist film is then patterned at the position aligned with the preliminary contact hole 17a. Then, using CHF$_3$ and CO as etching agent having higher selectivity for the silicon oxide layer in comparison with that for the silicon nitride layer, dry etching for the oxide layer is performed to remove the desired portion of the third, second and first interlayer insulation layers 16a, 10a and 8a to provide the contact hole 17 exposing a part of the surface of the N-type impurity diffusion layer 6 is exposed.

Thereafter, a conductive layer (not shown) of aluminum or the like is formed on the surface of the third interlayer insulation layer 16a in a thickness of 2000 to 10000 Å with burying the contact hole 17. Thereafter, the conductive layer is patterned by way of photolithographic and dry etching into a desired shape. Thus, the data line 19 electrically connected to the N-type impurity diffusion layer 6 via the second contact hole 17, is formed.

As shown in the shown embodiment, even for the semiconductor device using the conductive layer formed on the gate electrodes 5a, 5b and the load resistor 14 as the grounding wiring layer 9, the present invention is applicable.

Also, even in the shown embodiment, similarly to the first embodiment, after providing the preliminary contact hole 17a, the upper surface of the grounding wiring layer 9 is covered with the first silicon nitride layer 20. In conjunction therewith, the side wall surface of the grounding wiring layer facing the preliminary contact hole is covered with the side wall insulation layer 21 of the second silicon nitride layer. Accordingly, it becomes unnecessary to form the insulation layer on the side wall surface every time of providing the contact holes in the subsequent steps. Thus, process step in fabrication of the semiconductor device can be reduced.

Also, in the shown embodiment, since the first silicon nitride layer 20 and the side wall insulation layer (second silicon nitride layer) have different etching selectivity to those of the interlayer insulation layers 10a and 8a, upon removal of the interlayer insulation layers 10a and 8a by etching, the contact holes 11 and 17 can be provided in self-align. Accordingly, even when precision in positioning of the mask is low, the contact hole can be provided at the desired position with high precision to facilitate the fabrication process of the semiconductor device.

Although the present invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodied within a scope encompassed and equivalents thereof with respect to the feature set out in the appended claims.

What is claimed is:

1. A semiconductor device comprising:
   a semiconductor element formed on a semiconductor substrate;

a first interlayer insulation layer formed on said semiconductor element;

a conductive layer formed on said first interlayer insulation layer;

a contact hole comprising first and second portions, said first portion provided through said conductive layer;

a second interlevel insulation layer formed on the upper surface of said conductive layer and the side wall surface of said first portion of said contact hole, maintaining the exposure of the first interlayer insulation layer; and said second portion of said contact hole provided though said first interlayer insulation layer, and formed concentrically with said first portion of said contact hole, said second portion of said contact hole exposing said semiconductor element.

2. A semiconductor device as set forth in claim 1, wherein said first interlayer insulation layer has different etching selectivity to that of said second interlevel insulation layer.

3. A semiconductor device as set forth in claim 1, further comprising a third interlayer insulation layer formed on the upper surface of said second interlevel insulation layer, wherein the exposure of the first interlayer insulation layer is maintained.

4. A semiconductor device as set forth in claim 3, wherein said second interlayer insulation layer has different etching selectivity to those of said first and third interlayer insulation layers.

5. A semiconductor device as set forth in claim 3, wherein said first and third interlayer insulation layers are formed of silicon oxide and said second interlevel insulation layer is formed of silicon nitride.

6. A semiconductor device as set forth in claim 1, wherein said conductive layer is a grounding wiring layer formed over substantially an entire surface of said semiconductor substrate.

7. A semiconductor substrate as set forth in claim 6, wherein said grounding wiring layer is formed of a conductive material selected among a group consisting of polycrystalline silicon and tungsten silicide.

8. A semiconductor device as set forth in claim 1, wherein said second portion of said contact hole is positioned concentrically with said first portion of said contact hole to overcome misalignment of said first portion of said contact hole.

9. A semiconductor device as set forth in claim 1, further comprising a second conductive layer formed on said second interlevel insulation layer, and electrically connected with said semiconductor element via said first and said second portions of said contact hole.

10. A semiconductor device as set forth in claim 9, wherein said second conductive layer is formed of a conductive material selected among a group consisting of polycrystalline silicon.

11. A semiconductor device comprising:

a semiconductor element formed on a semiconductor substrate;

a first interlayer insulation layer formed on said semiconductor element;

a conductive layer formed on said first interlayer insulation layer;

a contact hole comprising first and second portions, said first portion of said contact hole having a first predetermined diameter, provided through said conductive layer;

a second interlevel insulation layer formed on the upper surface of said conductive layer and the side wall surface of said first portion of said contact hole, maintaining the exposure of the first interlayer insulation layer; and said second portion of said contact hole having a second predetermined diameter, less than said first predetermined diameter of said first portion of said contact hole, provided though said first interlayer insulation layer and formed concentrically with said first portion of said contact hole, said second portion of said contact hole exposing said semiconductor element.

12. A semiconductor device as set forth in claim 11, further comprising a third interlayer insulation layer formed on the upper surface of said second interlevel insulation layer.

13. A semiconductor device as set forth in claim 12, wherein said first and third interlayer insulation layers are formed of silicon oxide and said second interlevel insulation layer is formed of silicon nitride.

14. A semiconductor device as set forth in claim 11, wherein said conductive layer is a grounding wiring layer formed over substantially an entire surface of said semiconductor substrate.

15. A semiconductor substrate as set forth in claim 14, wherein said grounding wiring layer is formed of a conductive material selected among a group consisting of polycrystalline silicon and tungsten silicide.

16. A semiconductor device as set forth in claim 11, wherein said second portion of said contact hole is positioned concentrically within said first portion of said contact hole to overcome misalignment of said first portion of said contact hole.

17. A semiconductor device as set forth in claim 11, further comprising a second conductive layer formed on said second interlevel insulation layer, and electrically connected with said semiconductor element via said first and said second portions of said contact hole.

18. A semiconductor device as set forth in claim 17, wherein said second conductive layer is formed of a conductive material selected among a group consisting of polycrystalline silicon.

* * * * *